United States Patent
Joshi et al.

(10) Patent No.: US 11,914,304 B2
(45) Date of Patent: *Feb. 27, 2024

(54) CONTROLLING POROSITY OF AN INTERFERENCE LITHOGRAPHY PROCESS BY FINE TUNING EXPOSURE TIME

(71) Applicant: Toyota Motor Engineering & Manufacturing North America, Inc., Plano, TX (US)

(72) Inventors: Shailesh N. Joshi, Ann Arbor, MI (US); Gaurav Singhal, Champaign, IL (US); Paul Vannest Braun, Champaign, IL (US); Danny J. Lohan, Ann Arbor, MI (US); Kai-Wei Lan, Champaign, IL (US)

(73) Assignees: Toyota Motor Engineering & Manufacturing North America, Inc., Plano, TX (US); The Board of Trustees of the University of Illinois, Urbana, IL (US)

( * ) Notice: Subject to any disclaimer, the term of this patent is extended or adjusted under 35 U.S.C. 154(b) by 161 days.

This patent is subject to a terminal disclaimer.

(21) Appl. No.: 17/394,926

(22) Filed: Aug. 5, 2021

(65) Prior Publication Data

US 2023/0045339 A1 Feb. 9, 2023

(51) Int. Cl.
*G03F 7/40* (2006.01)
*G03F 7/42* (2006.01)
(Continued)

(52) U.S. Cl.
CPC ......... *G03F 7/70408* (2013.01); *C25D 5/022* (2013.01); *G03F 7/039* (2013.01);
(Continued)

(58) Field of Classification Search
None
See application file for complete search history.

(56) References Cited

U.S. PATENT DOCUMENTS

| 5,315,417 A | * | 5/1994 | Moss | G02B 5/32 |
| | | | | 430/1 |
| 2023/0042586 A1 | * | 2/2023 | Joshi | G03F 1/78 |

(Continued)

FOREIGN PATENT DOCUMENTS

| CN | 104190482 A | * | 12/2014 | |
| EP | 816920 A2 | * | 1/1998 | B41C 1/055 |

(Continued)

OTHER PUBLICATIONS

Ning et al. "holographic patterning of high-performance on-chip 3D lithium-ion microbatteries", PNAS vol. 112 (21) pp. 6573-6578 (May 2015).*

(Continued)

*Primary Examiner* — Martin J Angebranndt
(74) *Attorney, Agent, or Firm* — Christopher G. Darrow; Darrow Mustafa PC

(57) ABSTRACT

A method to control the density of a three-dimensional photonic crystal template involves changing the irradiation time from at least four laser beams to yield a periodic percolating matrix of mass and voids free of condensed matter from a photoresist composition. The photoresist composition includes a photoinitiator at a concentration where the dose or irradiation is controlled by the irradiation time and is less than the irradiation time that would convert all photoinitiator to initiating species such that the density of the three-dimensional photonic crystal template differs for different irradiation times. A deposition of reflecting or absorbing particles can be patterned on the surface of the (Continued)

photoresist composition to form a template with varying densities above different areas of the substrate.

20 Claims, 6 Drawing Sheets

(51) Int. Cl.
*G03F 7/039* (2006.01)
*G03H 1/12* (2006.01)
*G03F 7/00* (2006.01)
*C25D 5/02* (2006.01)

(52) U.S. Cl.
CPC ............... *G03F 7/40* (2013.01); *G03F 7/422* (2013.01); *G03F 7/70025* (2013.01); *G03H 1/12* (2013.01)

(56) References Cited

U.S. PATENT DOCUMENTS

| | | | |
|---|---|---|---|
| 2023/0044343 A1* | 2/2023 | Joshi | G02B 6/1225 |
| 2023/0044483 A1* | 2/2023 | Joshi | C25D 1/20 |

FOREIGN PATENT DOCUMENTS

| | | | |
|---|---|---|---|
| JP | 2005260178 A | * | 9/2005 |
| JP | 06102809 B2 | * | 3/2017 |

OTHER PUBLICATIONS

Shen et al., "Eight fold photonic quasi-crystal fabricated by prism assisted holographic lithography" Proc. SPIE 8632, article 86320 (8pp) (02-2103).*

Yeo et al., Nanofabrication with laser holographic lithography for nanophotonic structures:, J. Laser Micro/nanoengineering vol. 2(1) 5 page (2007).*

Park et al., J. Micro/Nanolith MEMS Moems vol. 10(1) article 013011 5 pages (Jan. 3, 2011).*

Joye et al., "UV-LIGA microfabrication of 220 GHz sheet beam amplifier gratings with SU-8 photoresists", J. Micromech, Microeng. Vol. 20 Article 125016 (11pp) (2010).*

Zhang et al., "3D holographic photonic crystals containing embedded functional features", Adv. Opt. Mater., vol. 4 pp. 1533-1540 (2016).*

Do et al., "High aspect ratio submicrometer two-dimensional structures fabricated by one-photoabsorption direct laser writing", Microsys. Technol., vol. 20 (10-11) pp. 2097-2102 (2014).*

Han et al., "Graded photonic crystals by optical interference holography", J. Opt. vol. 14 articles 085104 9 pages (2012).*

Chen, "Fabrication and Characterization of Three Dimensional Photonic Crystals Generated By Multibeam Interference Lithography," Dissertation, University of Illinois at Urbana-Champaign, 2009 (152 pages).

Chen et al., "Fabrication of high-aspect-ratio Fresnel zone plates by e-beam lithography and electroplating," J. Synchrotron Rad. 2008, 15, pp. 170-175 (6 pages).

Campbell et al., "Fabrication of photonic crystals for the visible spectrum by holographic lithography", Nature, vol. 404, Mar. 2, 2000, pp. 53-56 (4 pages).

* cited by examiner

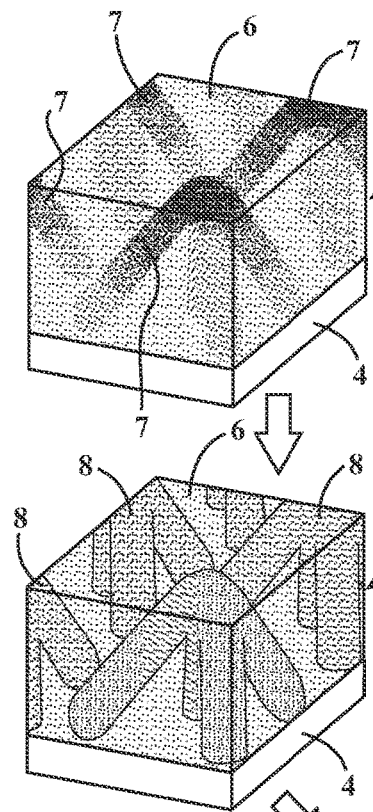
FIG. 4B'
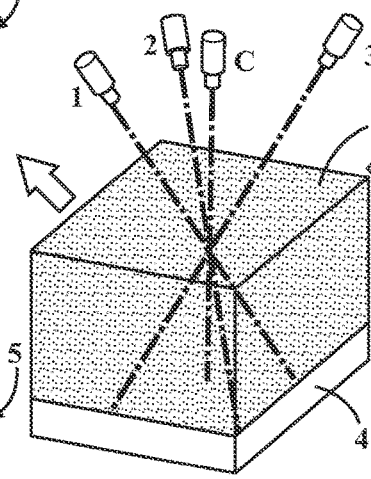
FIG. 4A
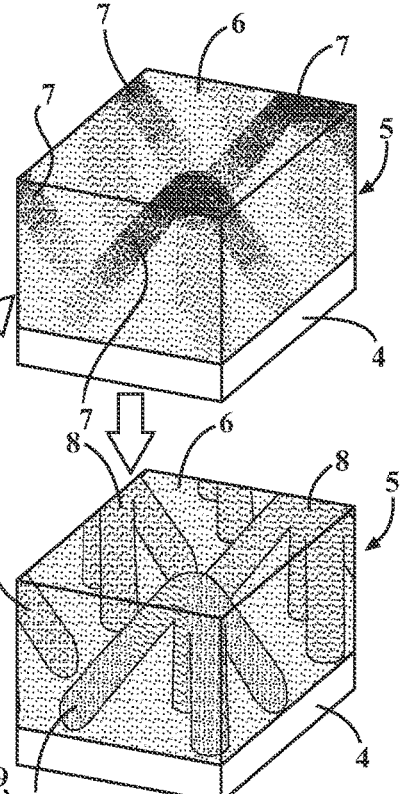
FIG. 4B
FIG. 4C'
FIG. 4C
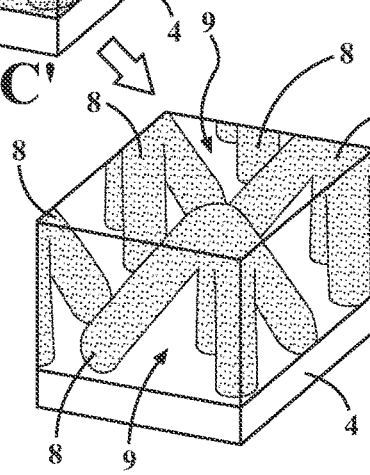
FIG. 4D'
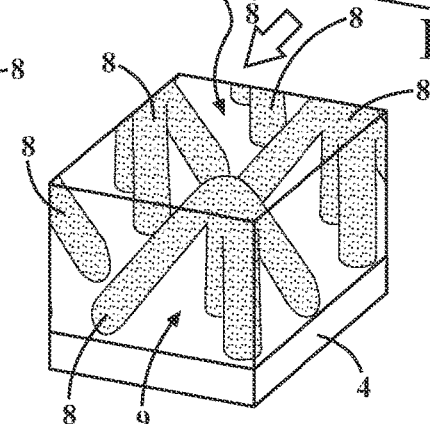
FIG. 4D 0.2 sec 0.5 sec 1 sec // CONTROLLING POROSITY OF AN INTERFERENCE LITHOGRAPHY PROCESS BY FINE TUNING EXPOSURE TIME

TECHNICAL FIELD

The present disclosure generally relates to a method to control the sizes of voids relative to cross-linked resin from holographic lithography of a photoresist.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

The formation of a three-dimensional photonic crystal provides a structure where, due to a favorable geometry of voids and mass of high refractive index, photonic band gaps can be prepared where light does not propagate in any direction. These crystals have been developed with the goal of forming enabling devices for optical switching, sensors, filters, wave guides, or any other structure that is functional due to a universally connected structure with percolating pores throughout. These materials have features with dimensions of the nanometer and micrometer scales. A method to produce such materials is by holographic lithography or multibeam interference lithography. Multibeam interference lithography does not provide a flexibility and resolution that is exhibited by other techniques, such as electron or ion beam lithography (EBL or IBL), however, superior patterning speed and pattern coherence are observed at scales larger than about 10 nanometers.

In multibeam interference lithography, four laser beams can be used to generate a three-dimensional periodicity resulting from the constructive and destructive interference patterns that define the void pattern. Three-dimensional structures have been fabricated by a light activated polymerization of a photoresist composition. The polymerization is carried out in a post-patterning baking process, where initiation results without significant propagation during the lithographic process.

Upon activation of a sufficient amount of photoinitiator in the photoresist composition, the development of a three-dimensional photonic crystal occurs when the photolyzed mass is developed by baking to a temperature where polymerization and crosslinking of the photoresist occurs. Subsequent dissolution of unreacted or insufficiently reacted regions where no gelation occurs forms a continuous periodic pattern of voids within the continuous periodic pattern of solid matter. The degree of diffusion of the active centers during polymerization and cross-linking from the volumes of constructive interference to volumes with destructive interference during the development steps of baking and removal of the ungelled regions is typically not considered in the process. Considering this phenomena, a method of controlling the proportion of void in a three-dimensional photonic crystal is presented.

SUMMARY

This section provides a general summary of the disclosure and is not a comprehensive disclosure of its full scope or all features of embodiments.

In various aspects, the present teachings provide a method to form three-dimensional periodic structures having features of about 0.1 to 10 microns. The structure is prepared by a multibeam interference lithography process with a negative photoresist, which, after development of the exposed photoresist, forms a periodic pattern of solid constructive volumes and void destructive volumes. Use of laser beams of non-equal intensity and imposed interference allow the periodic structures to be formed on a non-reflective or a reflective substrate. Reflective substrates include substrates with sufficient electrical conductivity to use the periodic structure as a three-dimensional photonic crystal template for electrodeposition methods. Salt or metal can thereby decorate surfaces of the templates, or templates can be completely infused with metals or other materials. Such materials can be generated for uses such as supported catalysis and heat transfer materials. The three-dimensional photonic crystal template can be subsequently modified to generate active devices that are supported by or formed within the voids of the periodic template. Electrodeposition of metals can be performed using the three-dimensional photonic crystal template. The method allows control of the proportion of solid volume and void volume in the template by imposing differences in the dosage of light provided by the laser beams by varying the irradiation time at a fixed light intensity. The proportion of the solid volume to the void volume, a density distribution, can be varied without variation in the photoresist composition, the orientation of the laser beams, or the wavelength of light used. The proportion of voids can be varied as desired by choice of the irradiation time of the laser beams, yet otherwise retaining the same periodic pattern throughout the three-dimensional photonic crystal template.

In another aspects, the present teachings provide a method to perform multibeam interference lithography with at least four laser beams where a negative photoresist is patterned on a substrate without anomalies due to undesired mass in the void destructive volumes and with a fixed proportion of constructive volume to destructive volume. In one embodiment, a central beam can be delivered perpendicularly to the reflective substrate and a multiplicity of equally spaced beams relative to the central beam disposed at an angle of less than about 40° to the central beam. By having a central beam of greater intensity than the other beams and by using a light dose that is small, being insufficient to activate all photoinitiator within a negative photoresist composition, a difference in initiator generated within the constructive volume can be varied as desired.

In still further aspects, the present teachings provide a photoresist composition including a photoinitiator at a concentration that assures the retention of photoinitiator in a developed three-dimensional photonic crystal template therefrom; and allows a variation in the proportion of solid and void volumes, a density distribution, in a three-dimensional photonic crystal template after a fixed development procedure based exclusively on a difference of the irradiation dose. The photoinitiator is included in the photoresist composition at a concentration that exceeds a concentration that allows total gelation of the photoresist in two minutes for a defined intensity of light, generally set by the laser system employed for holographic lithography. With this photoresist composition, the proportion of void volume can be diminished by an increase in the irradiation period employed without any other variations in the process.

Further areas of applicability and various methods of enhancing the above coupling technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein:

FIG. 4A is an example of the irradiation of a structure by laser beams, the structure including a reflective substrate with an SU-8 layer deposited thereon.

FIG. 4B is an example of the structure of FIG. 4A after irradiation, showing an irradiation-formed pattern of photogenerated acid.

FIG. 4B' is an example of the structure of FIG. 4A after irradiation, showing an irradiation-formed pattern of photogenerated acid, the irradiation time being greater than in FIG. 4B thereby forming more photogenerated acid in the same volume.

FIG. 4C is an example of the structure of FIG. 4B after baking, showing a volume of unreacted SU-8 monomer and photoinitiator remaining in a continuous periodic pattern contacting a complementary crosslinked polymer in a continuous periodic pattern.

FIG. 4C' is an example of the structure of FIG. 4B' after baking, showing a volume of unreacted SU-8 monomer and photoinitiator remaining in a continuous periodic pattern contacting a complementary crosslinked polymer in a continuous periodic pattern.

FIG. 4D is an example of the structure of FIG. 4C after dissolving of the monomer and non-crosslinked polymer, showing a pattern of connected voids residing within the three-dimensional photonic crystal template of cross-linked polymer from SU-8.

FIG. 4D' is an example of the structure of FIG. 4C' after dissolving of the monomer and non-crosslinked polymer, showing a pattern of connected voids residing within the three-dimensional photonic crystal template of cross-linked polymer from SU-8.

Figure 1:
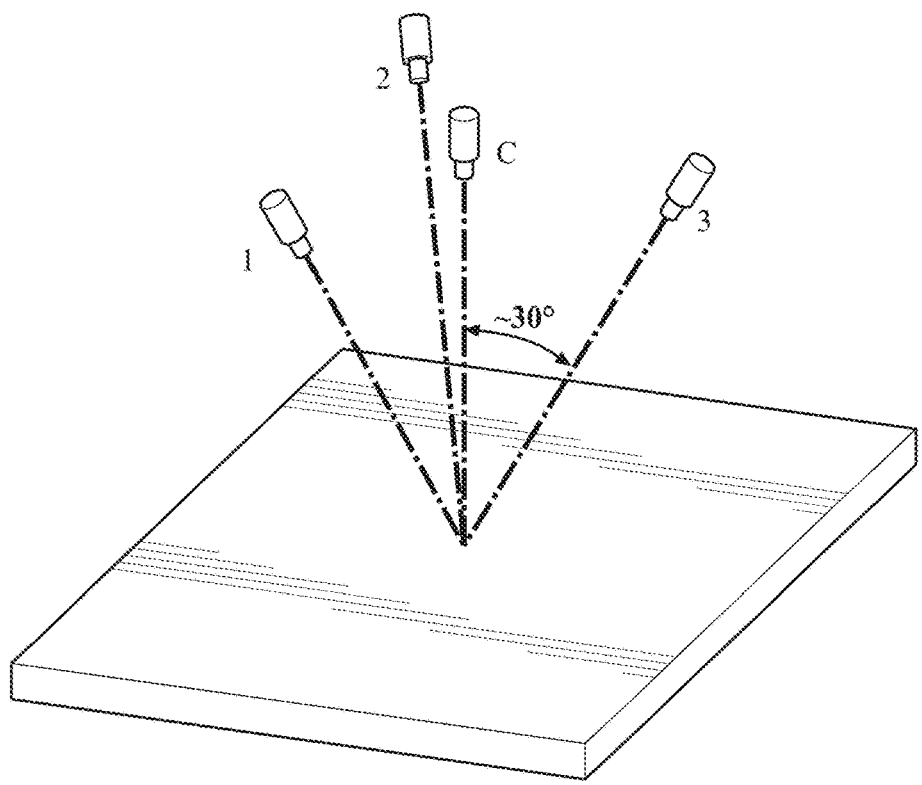
FIG. 1 shows a drawing of the orientation of four laser beams, C, 1, 2, and 3 for the controlling step in a process for the generation of three-dimensional photonic crystal templates according to one aspect of the present technology.

It should be noted that the figures set forth herein are intended to exemplify the general characteristics of the methods, algorithms, and devices among those of the present technology, for the purpose of the description of certain aspects. These figures may not precisely reflect the characteristics of any given aspect and are not necessarily intended to define or limit specific embodiments within the scope of this technology. Further, certain aspects may incorporate features from a combination of figures.

DETAILED DESCRIPTION

The present teachings provide a method for preparing a three-dimensional photonic crystal template on a substrate. For purposes of embodiments, the substrate may be any material, and may be a reflective or a non-reflective substrate. A reflective substrate may be conductive, where, for purposes of some embodiments, the substrate is conductive when the substrate material displays a conductivity greater than deionized water. In various embodiments, the three-dimensional photonic crystal template has a periodic structure without defect features due to an unintended degree of cross-linking initiated by reflected light rays in destructive volumes, which are regions with destructive interference and intended to be removed from the volume derived from constructive volumes upon dissolving a photoresist composition in the destructive volumes during a development step for the template. When a reflective substrate is employed, no insulating antireflective coating to minimize reflectance is situated between the substrate and the patterned cured photoresist, if sufficient conductivity is desired for use of the three-dimensional photonic crystal template. The three-dimensional photonic crystal template is suitable for preparing periodic porous structures for use in supported catalysts, metallic heat transfer devices, other metallic devices, or other non-metallic devices, where metallic devices can be formed by electroplating. The remaining mass of the cured photoresist features in the constructive volume can vary and is controlled by the light dose that is employed relative to a photoinitiator content for generation of an initiating species in any given development recipe. The light dose is insufficient to effectively activate all photoinitiator in the negative photoresist composition when the photoinitiator is included at a concentration that would result in total loss of the void volume if irradiated for two seconds at a fixed light intensity from the laser beams and with a common baking and developing procedure.

The presently disclosed three-dimensional photonic crystal templates are generated by an interference lithographic method using four or more laser beams where the beams are of unequal intensity. The periodicity of the three-dimensional photonic crystal template is controlled by the orientation of the laser beams employed to carry out the lithographic process. In one embodiment, although differing orientations and alignments of beams are possible, one beam is situated perpendicular to the substrate supporting the patternable photoresist and three beams are situated about 120° apart and directed at an acute angle, generally, but not necessarily, less than about 40° to the central beam and intersecting with the central beam at an air or inert gas-photoresist interface. The central perpendicular beam can be of greater intensity, for example, about four times the intensity, of the other three beams, individually or collectively. By using this geometry and a reflective substrate, the dose required for pattern formation is achieved with a very short irradiation period, for example, less than about 0.3 seconds. The laser orientation provides a sufficient dose for patterned initiator generation throughout the photoresist in constructive volumes with the short irradiation, but the reflected light is of insufficient intensity to allow an insoluble mass to be formed in the destructive regions where the irradiation geometry and the light dose is set to avoid photoinitiation in those volumes where voids are to be formed after development of the photoresist composition. By fixing the laser intensity, modification of the process requires manipulation of only the exposure time. In this manner, a three-dimensional photonic crystal template can be constructed where the proportion of developed solid volumes derived from the constructive volume to void volumes defined by the destructive volumes, a density distribution, can be controlled by varying only the irradiation time used. To assure that the irradiation time can permit the control of the proportions of the two volumes within the three-dimensional photonic crystal template, the photoresist composition that is used has a sufficiently large concentration of photoinitiator, such that additional irradiation time generates more active species from the photoinitiator as desired. If the photoinitiator is insufficient, an increase in the proportion of constructive volume with greater irradiation time does not occur over a broad range of irradiation times.

As detailed herein, the method for making periodic photonic crystal templates uses a fixed, though not equal, laser intensity for all beams. The fraction of the final three-dimensional photonic crystal templates that are void is controllable and is inversely proportional to the dose period. In this manner, the smaller an irradiation time, the lesser quantity of an active species is generated and the smaller the mass of cured resin per volume for a given arrangement of laser beams. The activated photoinitiator concentration is reflected in the mass volume of the resulting template using a fixed time, temperature, and solvent profile in a common development procedure. In this manner, the manufacturing process can be readily altered by only the exposure time. As the exposure period is controlled by effectively switching the laser on and off, the void portion of the template can be altered as desired from template to template, even during a production run.

In one embodiment, by the deposition of a pattern of reflectors or absorbers on the surface of the deposited photoresist before exposure, the light dose in various portion of the photoresist composition for a given irradiation time differs where portions under the reflectors or absorbers have a smaller dose than those not decorated by the reflectors or absorbers. The reflectors or absorbers can be any particulate material that reflects or absorbs the wavelength of laser light employed. The pattern can be prepared by stamping, ink-jet printing, or any other printing technique that can impose any desired pattern where the pattern can be of micron dimensions or greater where the density imposed along the area of the template that is formed can vary according to the pattern.

The three-dimensional photonic crystal templates of the present disclosure can be used as a template for processes that require a sufficiently conductive substrate, such as a silicon substrate, to allow electrodeposition or other processes that use the substrate as an electrode. In this manner, a relatively large area template with nanometer to micrometer features can be formed with a simple short burst of laser light. The three-dimensional photonic crystal template can be of various negative photoresists, when the initiation of polymerization can be generated photolytically by the laser wavelengths employed. In general, the polymerization is a living or controlled diffusion polymerization, such as a photo-cationic, photo-anionic, or a photo-generated reversibly stabilized radical polymerization. For example, the negative photoresist can be SU-8 where a multi-epoxy monomer is polymerized via a cationic photo-initiator that is activated by the light projected across the surface and the interference pattern of initiating cations is formed within the glassy photoresist. By appropriate choice of the angle of the laser beams to the substrate, the reflected light from the reflective substrate can be complementary to the incident light for generating a desirable three-dimensional photonic crystal template.

Figure 2:
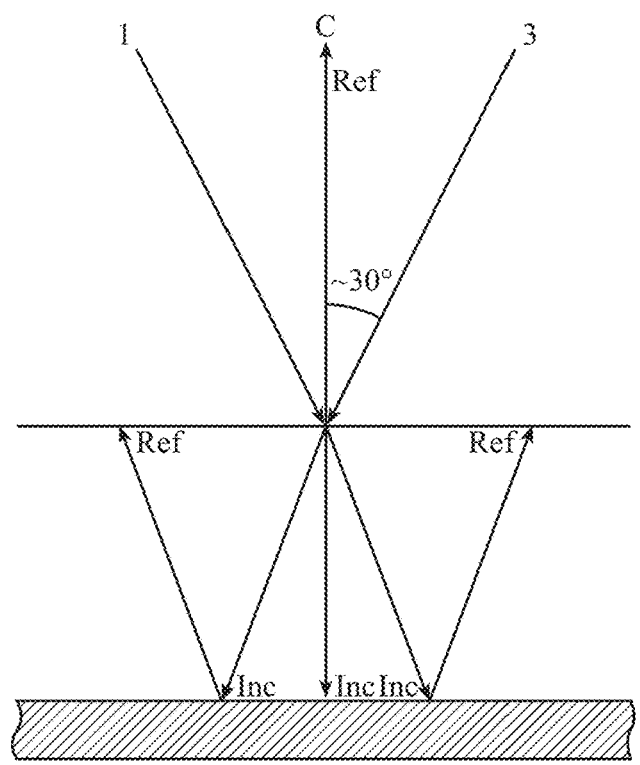
FIG. 2 is a drawing indicating a projection of laser beams C and 1 and 3 of FIG. 1 where the colinear incident and reflectance of C contrasts with the reflectance of the incident beams 1 and 3 according to one aspect of the present technology.

In one aspect, the laser beams may be oriented in the manner illustrated in FIG. 1, where the central beam (C) is perpendicular to the substrate surface with three other beams (1, 2, and 3) oriented with an angle of about 30° to beam C, and where beams 1, 2, and 3 are oriented at about 120° to each other. The intensity of beam C may be about 3.7 times the intensity of beams 1, 2, and 3, which are of the same intensity. The beams are all in the same phase, being split from a single source beam. As shown in FIG. 2, the path of beam C is such that the incident beam and reflected beam from the reflective substrate are co-linear and provide a nearly doubling of the intensity of the light along beam C's orientation and does not promote a reflection defect activation. The reflection of incident beams 1, 2, and 3 are of significantly lower intensity, allowing the defect photo-initiated active species to be of insufficient concentration to develop a cross-linked structure at a sufficient rate to form a defect during a subsequent development step. This orientation and differing beam intensities allows for a full development of the intended interference pattern that defines the three-dimensional photonic crystal template by using a very short beam dose period, for example, as little as about 0.1 seconds of exposure.

In one aspect, the method does not require any modification of an established development protocol for initiation, polymerization, crosslinking, and developing to form the cured photoresist resin. A traditional process for forming and developing a photoresist is outlined in the flow chart provided in FIG. 3, beginning with the formation of an SU-8/ photo acid generator solution. The solution is spin-coated and deposited as a layer on a substrate, with the solvent subsequently evaporated. The layer is exposed laser beams to generate an interference pattern of acid initiator, where at this point in the process, control of the proportion of void structure in the final photonic crystal can be controlled by this step. The method proceeds to a baking step to polymerize an SU-8 structure in the interference pattern. In various aspects, the pattern is developed in PGME to remove free SU-8 monomer. For example, the pattern is subsequently developed by dissolving unpolymerized volumes of the structure. The proportion of the unpolymerized volume is inversely related to the period of irradiation. The removal of free SU-8 monomer may be followed with supercritical drying steps to ultimately yield the photonic crystal.

In the development of the polymer, which further effects the dissolving of the unpolymerized or insufficiently polymerized regions, diffusion rates of the generated active species, propagation rates of the photoresist polymer must be considered. As the degrees of initiation and propagation affect the diffusing species structures, controlling the three-dimensional photonic crystal template structure becomes a complicated process where a functional window is easily missed, which does not assure a desired specific structure where small difference in time, temperature and concentration all can promote a loss of control of avoiding defect structures. The control of the dosing rate has little error associated with it as the control is exclusively of the amount of initiator generated, particularly with photoinitiators with a high quantum yield, such as, but not limited to, iron-arene salts, such as, cyclopentadienyl(fluorene) iron (III) hexafluorophosphate as a cationic initiator. Photoinitiators which do not act as thermal initiators at temperatures employed for deposition on the substrate or baking during development are advantageous. Other iron—are salts that can be used include Irgacure 261, [Cp-Fe-Naph]PF$_6$, CFC, and CFA. Other photoinitiators include diaryliodonium salts and triarylsulfonium salts. The anion coupled to the cation of these photoinitiators can be, but are not limited to, PF$_6^-$, SbF$_6^-$, BF$_4^-$, triflate, and tosylate. A photosensitizer can be included with the photoinitiator. Useful photosensitizers include DIEF, RBAX, TIHF, Acridine Orange, and Erythrosin B. In this manner, the method is implemented by fine control of only one variable, the photonic dose, and does not require a consideration of the complicated multiple processes that occur during a development bake and void forming dissolving process.

Figure 3:
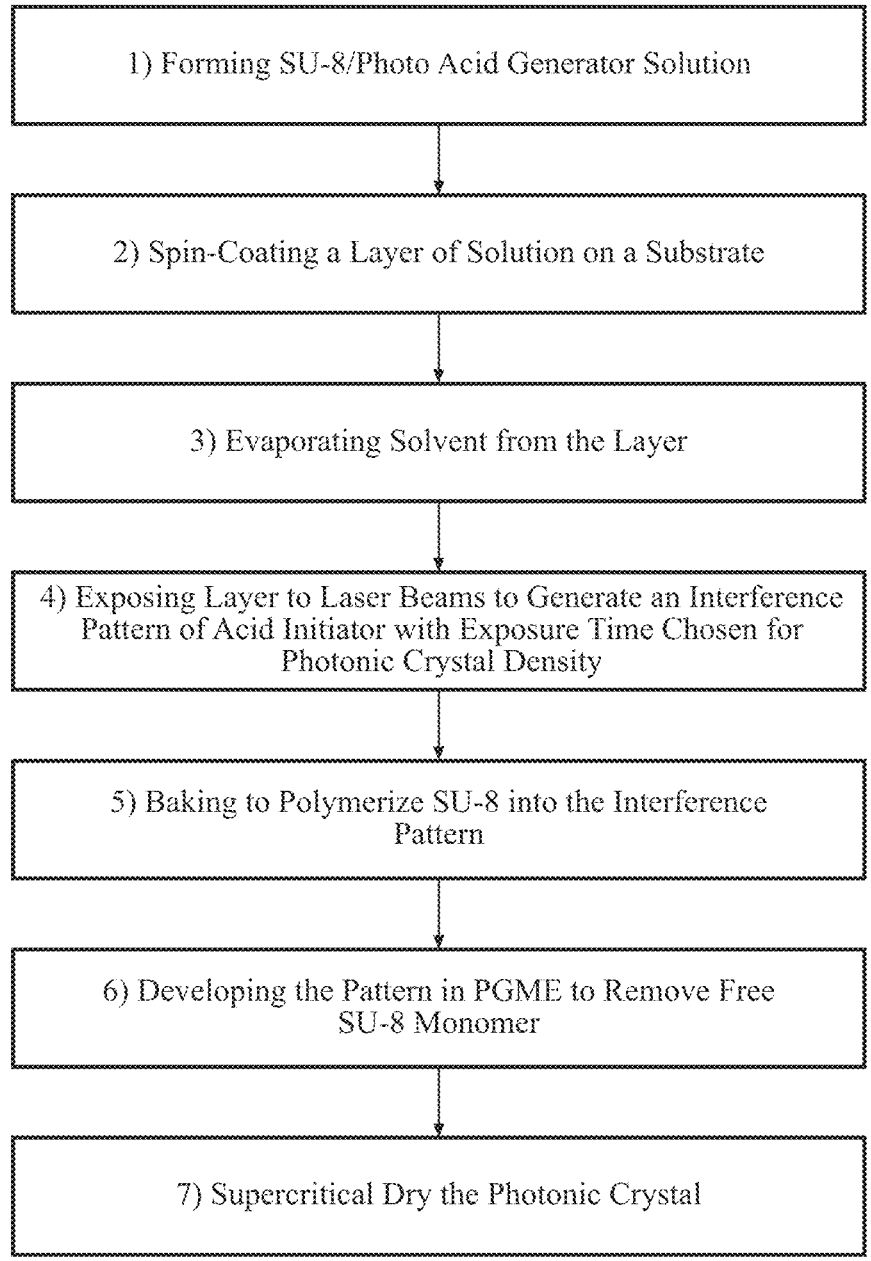
FIG. 3 is a flow chart of a production method to form a patterned photoresist according to one aspect of the present technology.

Portions of the process of FIG. 3 are graphically illustrated in FIGS. 4A-4D as well as in FIGS. 4A and 4B'-4D'. These figures illustrate structure determining steps, and the outcome after exposing a homogeneously dispersed photoinitiator in a polyfunctional monomer to form a pattern of photo-released acid that, upon baking, forms a pattern of solid cross-linked polymer by acid initiation, and yields the photonic crystal by dissolution of unreacted monomer and photoinitiator.

The exemplary structure of FIG. 4A includes a reflective substrate 4 with an SU-8 layer 5 deposited thereon. The SU-8 layer 5 includes a dispersed or dissolved photoinitiator 6 in order to provide a photo curable resin layer. Notably, FIGS. 4A-4D and FIGS. 4A and 4B'-4D' illustrate the formation of a portion of a layer of the photonic crystal along the z-axis, and it should be appreciated that this pattern may be displaced in the x-y plane, repeated in an overlapping manner, and displaced along the z-axis multiple times to form the entire photonic crystal, depending only upon the orientations of the laser beams and thickness of the photo curable resin layer. FIG. 4A begins the patterning process, and provides an exemplary illustration of the irradiation by laser beams 1, 2, 3, and C on the surface of the SU-8 layer 5. The relative thickness of deposited SU-8 layer 5 and substrate 4 in FIGS. 4A-4D and in FIGS. 4A and 4B'-4D' are not intended to limit the thickness of either layer, or their relative thickness. As shown in FIGS. 4B and 4B', the irradiation forms a pattern of photogenerated acid 7 generally being leveled by reaction with an epoxy group of the SU-8 as an initiated, but not propagating in the glassy SU-8. The irradiation time for the generation of photogenerated acid 7 is greater for FIG. 4B' than for FIG. 4B forming more photogenerated acid 7 in the same volume. The pattern of photogenerated acid 7 shown is exemplary in nature; and may begin with a gradient-like pattern with areas of different intensity, since the formation of photogenerated acid 7 generally occurs at locations where there is constructive interference of the beams, and the beam orientation may vary.

The post irradiation processing is represented by the transition of FIG. 4B to FIG. 4C and by the transition of FIG. 4B' to FIG. 4C', and includes baking the exposed substrate and photoresist composition to a temperature of less than about 90° C. but more than about 75° C., such as about 85° C. Because the photogenerated initiator photolytically decomposes to, for example, a Lewis acid, photogenerated acid 7, that adds to the polymerizable functionality of the photoresist, for example, an epoxy functionality of SU-8, polymerization of the multifunctional monomer and cross-linking occur to form a solid mass of crosslinked polymer 8 filled constructive volumes of the templates. The time for post baking depends on the temperature employed, where higher temperatures require less time. After the baking and post baking, a volume of unreacted SU-8 monomer 5 and photoinitiator 6 remains in a continuous periodic pattern contacting a complementary a crosslinked polymer 8 continuous periodic pattern, as shown in FIG. 4C and FIG. 4C'. Temperatures greater than the desired temperature result in polymerization beyond the constructive volume, and temperatures less than the desired temperature do not permit significant polymerization in the glassy film. With equivalent conditions of baking, a higher quantity of the photogenic acid 7 formed in FIG. 4B' relative to FIG. 4B, results in a greater number of active species for polymerization, which results in a lower average molecular weight of the initial polymer and a more rapid rate of heat generation by epoxy ring opening. These factors couple to allow more rapid propagation in the longer irradiated resin such that propagation extends beyond the photogenerated acid 7 pattern from the constructive volume before gelation inhibits additional translation of active centers and results in a higher proportion of the layer being gelled SU-8.

After baking, development continues with the dissolving of the monomer and non-crosslinked polymer in the destructive volumes that will generate the voids of the three-dimensional photonic crystal template. As shown in FIGS. 4D and 4D', this results in a pattern of connected voids 9 residing within the three-dimensional photonic crystal template of cross-linked polymer 8 from SU-8, where the difference in void proportion reflects the differences in the polymerization and gelation caused by the difference in the photogenic acid 7 formed upon irradiation. The dissolving of the non-crosslinked polymer in the destructive volumes generates the voids of the three-dimensional photonic crystal template. As active centers remain in the cross-linked volumes, the temperature and diffusion of photoresist solution from the developing three-dimensional photonic crystal template are set for an optimal generation of the template for a given irradiation time, and with a single processing line with constant conditions for baking and developing, a desired photonic crystal density difference can be controlled exclusively by the period of irradiation employed. The solvent used for dissolving the SU-8 monomer and oligomers can be propylene glycol monomethyl ether acetate (PGMEA) or any other solvent such as acetone, cyclopentanone, and tetrahydrofuran. These solvents swell the cross-linked SU-8 resin and, for example, PGMEA can be desorbed to a large extent by placing the three-dimensional photonic crystal template in isopropanol.

To avoid structural collapse of the voids during a final drying of the three-dimensional photonic crystal template due to surface tension effects, drying can be carried out using supercritical $CO_2$ where the liquid-vapor interface is beyond the critical point. The wet three-dimensional photonic crystal template is placed in liquid $CO_2$ followed by heating past the critical point and releasing the pressure until ambient pressure and temperature is achieved. The resulting three-dimensional photonic crystal template is isolated with distinct constructive volumes of cross-linked photoresist polymer and destructive volumes void of condensed matter.

Figure 5A:
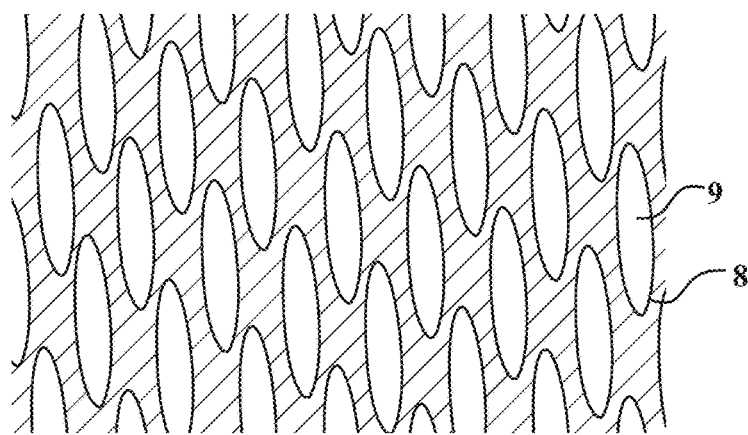
FIGS. 5A-5C shows drawings of planes of SU-8 derived photonic crystals perpendicular to the substrates using progressively longer irradiation times where longer irradiation times result in smaller voids.
Figure 5B:
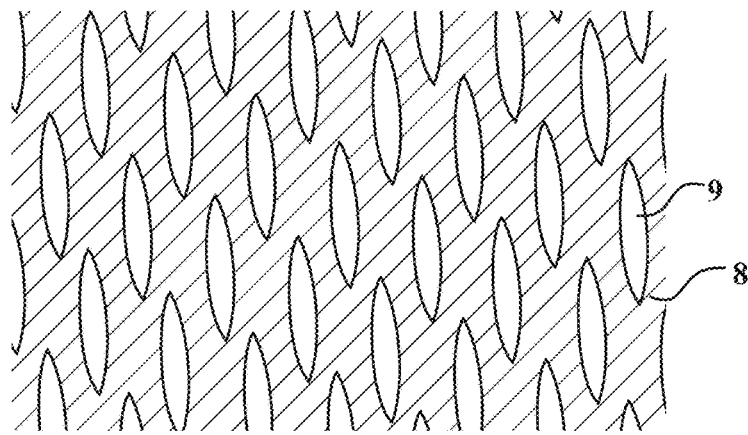
Figure 5C:
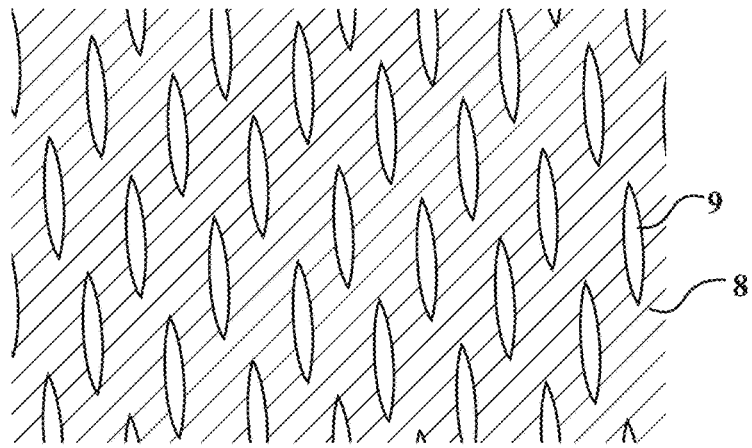

Modification of the irradiation profile during the formation of the three-dimensional photonic crystal template or by decorating the deposited photoresist surface with reflective or absorbing particles allows the formation of uniform, patterned or gradient periodic structures along any axis and bias the proportion of void volume in the template. This permits the formation of a metal matrix device that displays the negative of the template, where the void volumes result in the metal features and the resin features of the template generate the voids of the metal matrix upon degradation. The ability to control the void volume by control of the irradiation time is illustrated in FIGS. 5A-5C where a plane perpendicular to the substrate is shown with progressively longer irradiation times. As shown in FIG. 5A relatively large voids result with a short irradiation, whereas the increase in the period of photo-generating acid results in progressively smaller voids generated in a continuum of cured SU-8 resin after baking and development, as shown in FIGS. 5B and 5C.

The resulting polymeric three-dimensional photonic crystal template, when situated on a substrate with sufficient conductivity, can be used to fill the voids with a metal or other material that can be deposited by an electrodeposition process. In this manner, the avoidance of defects is critical to assure that the necessary percolation of voids through the template allows the growth throughout the entire template formed from the photoresist layer. Removal of the template allows development of a metallic device, where the positive features of the device are formed in the voids in the template. Other non-metal devices can be prepared, such as a high surface area catalytic supports, where the three-dimensional photonic crystal template is a scaffold for the deposition of a catalyst layer on the template.

Figure 6A:
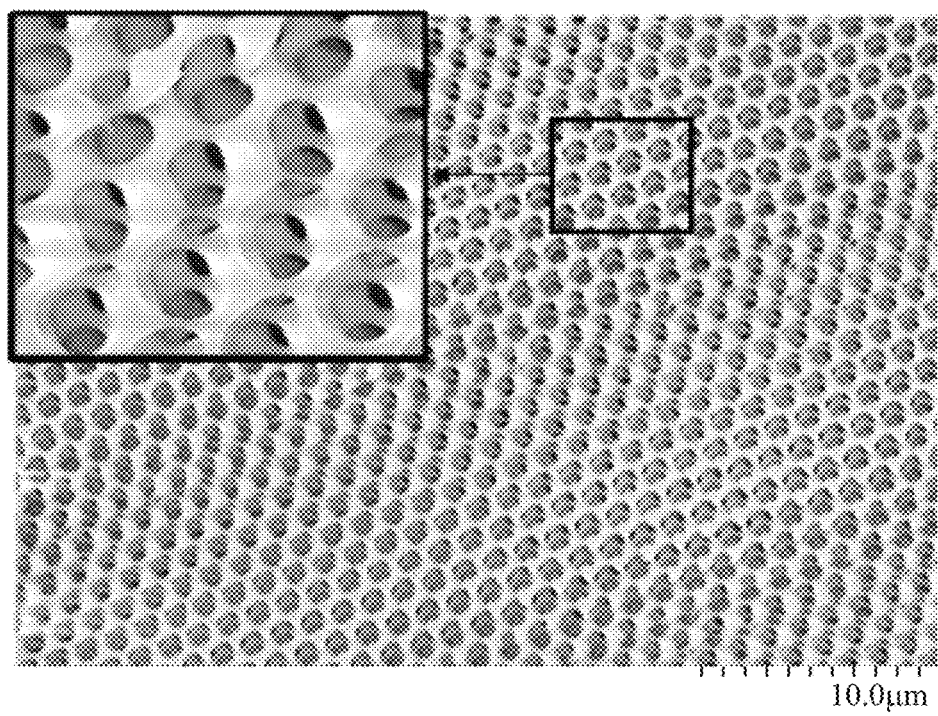
FIGS. 6A-6C show scanning electron micrographs of SU-8 derived photonic crystals using four-beam interference lithography and exposure times of 0.2, 0.5, and 1.0 second, respectively, from a photoresist composition according to one aspect of the present technology.
Figure 6B:
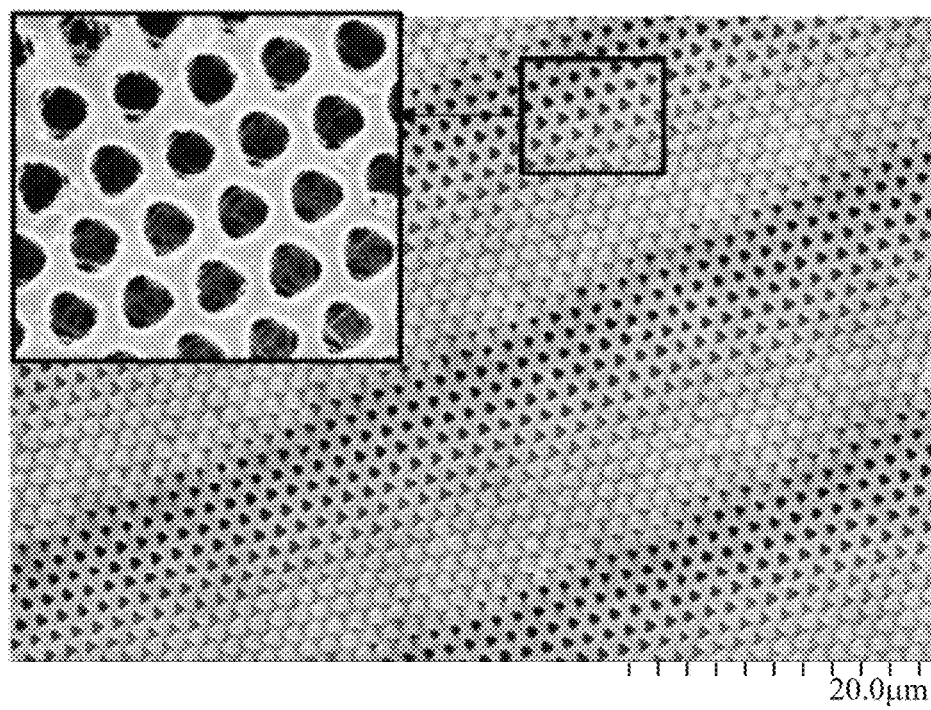
Figure 6C:
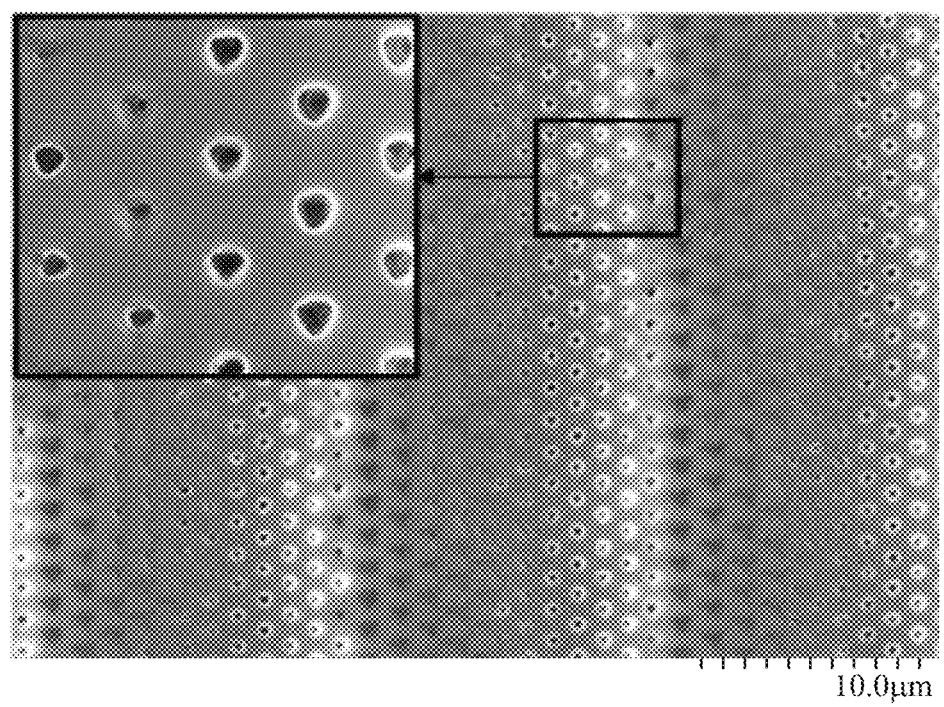

The use of a short irradiation time of about one second or less can generate three-dimensional photonic crystal templates having a proportion of constructive volume that is directly proportional to the irradiation time. As shown in FIG. 6A, an irradiation time of 0.2 seconds ultimately results after development a three-dimensional photonic crystal template having a percolating periodic matrix of destructive volume that is void of condensed matter and where the destructive volume is more than half of the volume of the template. When the irradiation time is about doubled, for example, as shown in FIG. 6B, for a three-dimensional photonic crystal template formed using a 0.5 second irradiation time, the proportion of a percolating matrix of constructive volume, where crosslinked and polymerized SU-8 derived resin resides, is about half of the template's volume. With yet longer irradiation, as illustrated in FIG. 6C for a one second irradiation, the percolating matrix of destructive volume is further diminished in proportion. These templates that have a like spatial distribution of the percolating periodic matrix elements of constructive and destructive volumes differ only by the proportion of the volumes. This easily imposed template variation can be used to generate devices that differ in surface area and mass as desired.

The deposition of light reflective or absorbing particles onto one or more portions of the surface of the photoresist composition after deposition but before irradiation allows for biased the volume under the particle deposition to yield different degrees of voids in the volume under the areas that contain or are absent of the particles. These particles can be deposited on the surface in a controlled concentration by printing or stamping techniques such that a desired degree of light is restricted from the photoresist under the light illuminated surface. In this manner, those areas with the particles can display a smaller concentration of initiator from the light activated photoinitiator and, subsequently upon development, a greater proportion of voids in the volume under the particle decorated areas of the surface can result. The portions of high and low void volume man be in any periodic or non-periodic pattern. By employing techniques, such as ink-jet printing, a gradient of particle concentrations can be deposited to generate a gradient of void volumes across the surface of the resulting three-dimensional photonic crystal template.

Methods

A diode pump solid state laser, Verdi 5W (Coherent Inc.), a frequency doubled Nd:YVO$_4$ laser, was used at 532 nm for multi-beam interference lithograph. The Verdi 5W laser has a maximum power of 5.5 W and a beam diameter of 2.25 mm with the beam expanded to as much as 9 mm using a spatial filter and sub-second exposure times. The optical platform employed a rigid table-top (Newport RS-4000) and pneumatic isolators (Newport I-2000) for vibration dampening. The beam was split into four beams and arranged by the mirrors into the umbrella geometry shown in FIG. 1. The power ratio of the beams was controlled by a polarizing cube beam splitter with a half waveplate situated before the splitter and additional half and quarter waveplates for adjusting the side and central beams, respectively, to yield a 3.7 to 1 intensity ratio of the central and side beams where the side beams are aligned at a 30° angle to the central beam.

The photoresist composition was SU-8, on average an octafunctional monomer, with cyclopentadienyl(fluorene) iron (III) hexafluorophosphate as photoinitiator and deposited as a solution in cyclopentanone and spin-coated on a silicon wafer. Solvent evaporation from the photoresist composition was carried out on a hot plate to a temperature of about 65° C. for ten minutes and about 95° C. for twenty minutes. After cooling to room temperature, exposure was restricted to 0.15 seconds using an electric shutter. After exposure, development was started with a bake at 85° C. for twenty minutes. After cooling to room temperature, PGMEA was used with gentle stirring to dissolve the destructive volumes and form the periodic structure of the three-dimensional photonic crystal template. Immersion of the template into isopropanol, a washing solvent, resulted in the extraction of residual PGMEA from the cured SU-8 resin. Supercritical drying was carried out by immersing the isopropanol wet SU-8 resin on the Si wafer in liquid $CO_2$ using a critical point dryer (Samdri 790) at about 0° C. and slowly heated through the critical point followed by slowly releasing the pressure to ambient and cooling to ambient temperature, which yielded the three-dimensional photonic crystal template on the Si wafer.

The preceding description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

As used herein, the term "about" includes exactly the term or number that it modifies and slight variations therefrom. "Slight variations therefrom" can include within 15 degrees/percent/units or less, within 14 degrees/percent/units or less, within 13 degrees/percent/units or less, within 12 degrees/percent/units or less, within 11 degrees/percent/units or less, within 10 degrees/percent/units or less, within 9 degrees/percent/units or less, within 8 degrees/percent/units or less, within 7 degrees/percent/units or less, within 6 degrees/percent/units or less, within 5 degrees/percent/units or less, within 4 degrees/percent/units or less, within 3 degrees/percent/units or less, within 2 degrees/percent/units or less, or within 1 degree/percent/unit or less. In some instances, "about" can include being within normal manufacturing tolerances.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

What is claimed is:

1. A method for controlling a density distribution of a three-dimensional photonic crystal template, comprising:
   depositing a photoresist composition comprising a photoinitiator homogeneously distributed throughout a volume of the photoresist composition on a substrate;
   depositing a plurality of light reflective and/or light absorbing particles on the photoresist composition resulting in at least two areas above the substrate having different amounts of the plurality of light reflective and/or light absorbing particles before irradiating;
   irradiating the photoresist composition with at least four laser beams using a multibeam interference lithograph system to generate a periodic interference pattern comprising a periodic pattern of a gradient constructive volume and a destructive volume in an exposed photoresist composition, where an exposure duration is less than 0.3 seconds, and where the photoinitiator is at a concentration greater than a maximum amount that photolyzes in two seconds;
   baking the exposed photoresist composition at a fixed temperature and time independent of the exposure duration to form a gradient-like periodic structure comprising a polymerized and gelled photoresist derived from the gradient constructive volume and an un-gelled photoresist in the destructive volume;
   dissolving the un-gelled photoresist with a solvent to form an un-gelled photoresist solution; and
   washing the un-gelled photoresist solution with a washing solvent from the three-dimensional photonic crystal template such that the three-dimensional photonic crystal template has a density gradient that is proportional to the exposure duration.

2. The method for controlling a density distribution of a three-dimensional photonic crystal template according to claim 1, further comprising drying the three-dimensional photonic crystal template of the washing solvent in the three-dimensional photonic crystal template.

3. The method for controlling a density distribution of a three-dimensional photonic crystal template according to claim 2, wherein drying is supercritical drying using $CO_2$.

4. The method for controlling a density distribution of a three-dimensional photonic crystal template according to claim 1, wherein the at least four laser beams comprise a central laser beam perpendicular to the substrate and a multiplicity of peripheral laser beams equally separated from the central laser beam and equally separated from each other, wherein the peripheral laser beams are at an angle of less than 40 degrees from the central laser beam.

5. The method for controlling a density distribution of a three-dimensional photonic crystal template according to claim 4, wherein the central laser beam has an intensity greater than an intensity of the peripheral laser beams individually.

6. The method for controlling a density distribution of a three-dimensional photonic crystal template according to claim 4, wherein the central laser beam has an intensity greater than an intensity of the peripheral laser beams collectively.

7. The method for controlling a density distribution of a three-dimensional photonic crystal template according to claim 4, wherein the central laser beam has an intensity of about 3.7 times an intensity of one of the peripheral laser beams.

8. The method for controlling a density distribution of a three-dimensional photonic crystal template according to claim 1, wherein the photoresist composition comprises: a cationic polymerizable photoresist and the photoinitiator is a cationic photoinitiator; an anionic polymerizable photoresist and the photoinitiator is an anionic photoinitiator; or a radical polymerizable photoresist and the photoinitiator is a radical photoinitiator comprising a reversibly stabilizing additive.

9. The method for controlling a density distribution of a three-dimensional photonic crystal template according to claim 8, wherein the cationic polymerizable photoresist is a bisphenol A novolac epoxy dissolved in an organic solvent.

10. The method for controlling a density distribution of a three-dimensional photonic crystal template according to claim 8, wherein the cationic photoinitiator is cyclopentadienyl(fluorene) iron (III) hexafluorophosphate.

11. The method for controlling a density distribution of a three-dimensional photonic crystal template according to claim 1, wherein the substrate is silicon.

12. The method for controlling a density distribution of a three-dimensional photonic crystal template according to claim 1,
   wherein a density of the three-dimensional photonic crystal template under the at least two areas with the plurality of light reflective and/or light absorbing particles is less than at least one area absent the plurality of light reflective and/or light absorbing particles.

13. A method for controlling a density distribution of a three-dimensional photonic crystal template, comprising:
depositing a photoresist composition comprising a photoinitiator homogeneously distributed throughout a volume of the photoresist composition on a silicon substrate;
depositing a plurality of light reflective and/or light absorbing particles on the photoresist composition resulting in at least two areas above the silicon substrate having different amounts of the plurality of light reflective and/or light absorbing particles before irradiating,
irradiating the photoresist composition with at least four laser beams using a multibeam interference lithograph system to generate a periodic interference pattern comprising a periodic pattern of a gradient constructive volume and a destructive volume in an exposed photoresist composition, where an exposure duration is less than 0.3 seconds, and where the photoinitiator is at a concentration greater than a maximum amount that photolyzes in two seconds;
baking the exposed photoresist composition at a fixed temperature and time independent of the exposure duration to form a gradient-like periodic structure comprising a polymerized and gelled photoresist derived from the gradient constructive volume and an un-gelled photoresist in the destructive volume;
dissolving the un-gelled photoresist with a solvent to form an un-gelled photoresist solution; and
washing the un-gelled photoresist solution with a washing solvent from the three-dimensional photonic crystal template such that the three-dimensional photonic crystal template has a density gradient that is proportional to the exposure duration and a density of the three-dimensional photonic crystal template under the at least two areas with the plurality of light reflective and/or light absorbing particles is less than at least one area absent the plurality of light reflective and/or light absorbing particles.

14. The method for controlling a density distribution of a three-dimensional photonic crystal template according to claim 13, further comprising drying the three-dimensional photonic crystal template of the washing solvent in the three-dimensional photonic crystal template.

15. The method for controlling a density distribution of a three-dimensional photonic crystal template according to claim 14, wherein drying is supercritical drying using $CO_2$.

16. The method for controlling a density distribution of a three-dimensional photonic crystal template according to claim 13, wherein the at least four laser beams comprise a central laser beam perpendicular to the silicon substrate and a multiplicity of peripheral laser beams equally separated from the central laser beam and equally separated from each other, wherein the peripheral laser beams are at an angle of less than 40 degrees from the central laser beam.

17. The method for controlling a density distribution of a three-dimensional photonic crystal template according to claim 16, wherein the central laser beam has an intensity greater than an intensity of the peripheral laser beams individually.

18. The method for controlling a density distribution of a three-dimensional photonic crystal template according to claim 16, wherein the central laser beam has an intensity greater than an intensity of the peripheral laser beams collectively.

19. The method for controlling a density distribution of a three-dimensional photonic crystal template according to claim 16, wherein the central laser beam has an intensity of about 3.7 times an intensity of one of the peripheral laser beams.

20. The method for controlling a density distribution of a three-dimensional photonic crystal template according to claim 13, wherein the photoresist composition comprises: a cationic polymerizable photoresist and the photoinitiator is a cationic photoinitiator; an anionic polymerizable photoresist and the photoinitiator is an anionic photoinitiator; or a radical polymerizable photoresist and the photoinitiator is a radical photoinitiator comprising a reversibly stabilizing additive.

* * * * *